United States Patent [19]

Satoh

[11] Patent Number: 5,127,010
[45] Date of Patent: Jun. 30, 1992

[54] PATTERN GENERATOR

[75] Inventor: Kazuhiko Satoh, Gyoda, Japan

[73] Assignee: Advantest Corporation, Tokyo, Japan

[21] Appl. No.: 476,485

[22] PCT Filed: Oct. 9, 1989

[86] PCT No.: PCT/JP89/01037
§ 371 Date: Jun. 6, 1990
§ 102(e) Date: Jun. 6, 1990

[87] PCT Pub. No.: WO90/04228
PCT Pub. Date: Apr. 19, 1990

[30] Foreign Application Priority Data

Oct. 11, 1988 [JP] Japan .................. 63-133189

[51] Int. Cl.⁵ .................................. G01R 31/28
[52] U.S. Cl. ................... 371/27; 371/21.1; 371/22.1
[58] Field of Search ............ 371/27, 21.1, 21.2, 371/21.3, 22.1, 25.1

[56] References Cited

U.S. PATENT DOCUMENTS

| 4,293,950 | 10/1981 | Shimizu et al. | |
|---|---|---|---|
| 4,313,200 | 1/1982 | Nishiura | 371/25.1 |
| 4,555,663 | 11/1985 | Shimizu | 371/27 |
| 4,584,683 | 4/1986 | Shimizu | 371/27 |
| 4,631,724 | 12/1986 | Shimizu | 371/27 |
| 4,635,096 | 1/1987 | Morgan | 371/27 |
| 4,670,879 | 6/1987 | Okino | 371/27 |
| 4,696,005 | 9/1987 | Millham et al. | 371/27 |
| 4,718,065 | 1/1988 | Boyle et al. | 371/27 |
| 4,736,375 | 4/1988 | Tannhäuser et al. | 371/27 |
| 4,775,977 | 10/1988 | Dehara | 371/27 |
| 4,797,886 | 1/1989 | Imada . | |

FOREIGN PATENT DOCUMENTS 54-774   1/1983 Japan .
61-201343 9/1986 Japan .

Primary Examiner—Jerry Smith
Assistant Examiner—Ly V. Hua
Attorney, Agent, or Firm—Staas & Halsey

[57] ABSTRACT

A data pattern generator in which the address generation of a program counter (11) is controlled in accordance with an operation code and an operand read out of an instruction memory (12'). An address/data pattern is generated in response to an address/data computing instruction read out of the instruction memory (12'). Random logic patterns for testing a logic circuit are prestored in a data buffer memory (18) and are read out therefrom using an address created by an address pointer (19). The address generation of the address pointer (19) is controlled by control instructions and data written in a control instruction memory (22) and a load data memory (21) which are accessed by an address provided from the program counter (11).

2 Claims, 3 Drawing Sheets

PATTERN GENERATOR

BACKGROUND OF THE INVENTION

1. Field of the Invention

The present relates to a pattern generator which generates patterns for testing logic circuits as well as for memories.

2. The Related Art

Heretofore, an algorithmic pattern generator has been used to generate patterns for testing semiconductor memories as disclosed in U.S. Pat. No. 4,293,950 or 4,797,886, for instance. In the conventional algorithmic pattern generator an instruction memory 12 is accessed using an address produced by a program counter, as schematically shown in FIG. 1. The instruction memory 12 is composed of an operation code field 13 which has stored therein instructions for JUMP, LOOP and other operations, an operand field 14 in which is stored an operand such as a loop count corresponding to, for example, the LOOP instruction of the operation code field 13, and a field 15 in which an address computing instruction, a data computing instruction and a control signal are stored. These fields 13, 14 and 15 are simultaneously read out at each address. The instruction from the operation code field 13 is decoded by an instruction decoder 16, by which the value of a program counter 11 is modified to, for example, a jump address of the JUMP instruction. In response to the instructions read out of the field 15, an arithmetic unit 17 generates an address pattern AP which is applied to a memory under test (not shown), a data pattern DP which is written into the memory under test and an expectation pattern EP of data which is output from the memory under test. Further, the arithmetic unit responds to the control signal from the field 15 to generate a write instruction and an instruction for comparison with the expectation pattern.

With the recent progress of semiconductor technology, there has emerged a memory for specific use which has incorporated therein a large number of logic circuits instead of providing therearound control circuits, as in normal memories.

Test patterns and expectation patterns for logic circuits are random patterns in many cases, and it has been considered impossible to employ the conventional algorithmic pattern generator for the generation of such random patterns, because it requires therefore an instruction memory of a storage capacity large enough to store an enormous number of instruction steps.

SUMMARY OF THE INVENTION

An object of the present invention is to provide a pattern generator which permits algorithmic generation of patterns for testing memories and the generation of random patterns for logic tests with simple instruction steps.

According to the present invention, patterns for testing random logic (logic circuits) are stored in a data buffer memory, which is accessed by an address pointer, address data for setting arbitrary address data in the address pointer is held in a load data memory, and load/increment control data for the address pointer is held in a control instruction memory. The load data memory and the control instruction memory are concurrently accessed from a program counter.

DESCRIPTION OF THE PREFERRED EMBODIMENT

Figure 1:
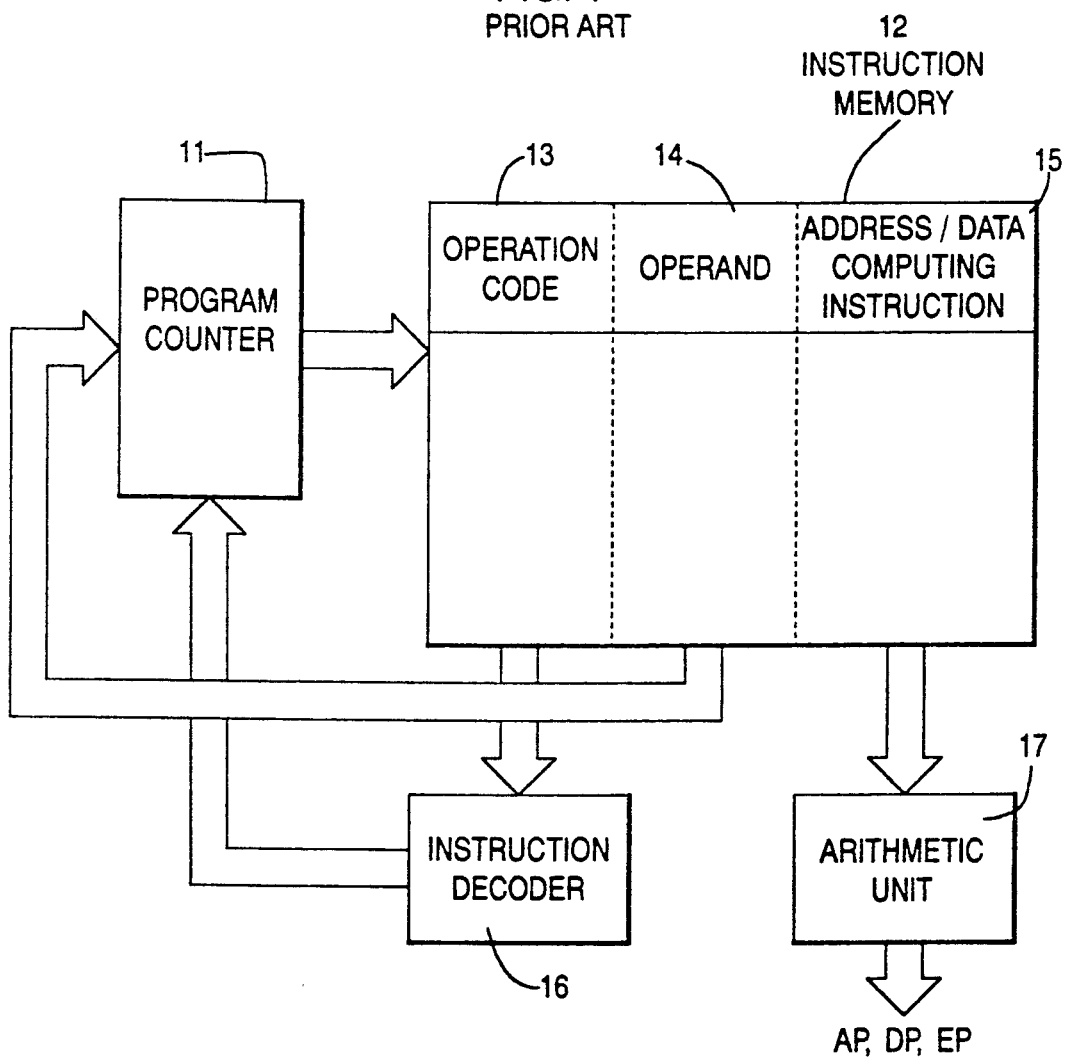
FIG. 1 is a block diagram of a conventional pattern generator.
Figure 2:
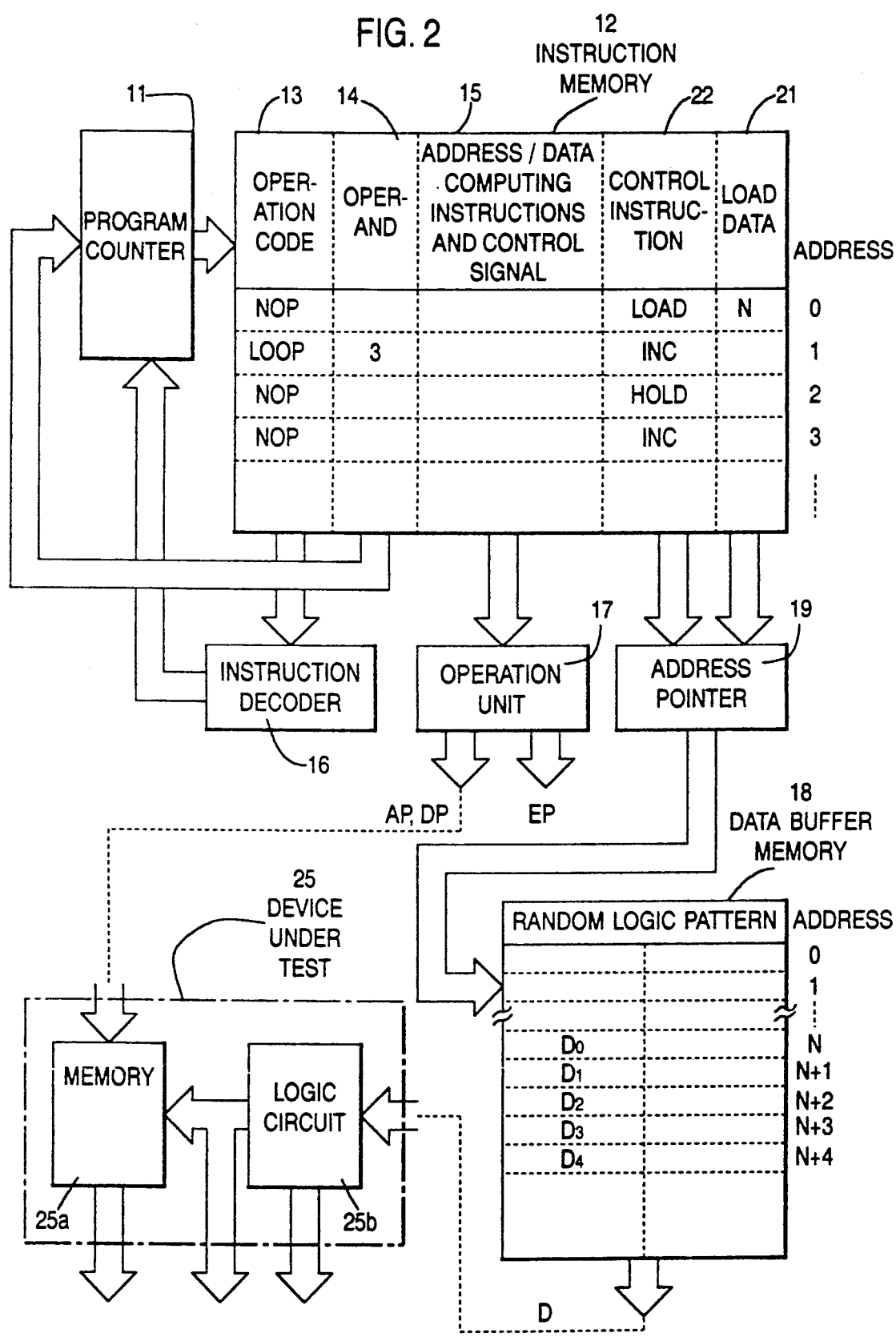
FIG. 2 is a block diagram illustrating an embodiment of the pattern generator of the present invention.

FIG. 2 illustrates an embodiment, in which the parts corresponding to those in FIG. 1 are identified by the same reference numerals. In the present invention a data buffer memory 18 is provided, in which random logic patterns for testing random logic (logic circuits) are stored at respective addresses. The data buffer memory 18 is accessed using the output value of an address pointer 19 as an address.

In this embodiment the instruction memory 12' further includes a load data field 21 and a control instruction field 22 at each address. Address data to be set in the address pointer 19 is written into the load data field 21. Load/increment control instruction data for the address pointer 19 is written into the control instruction field 22. It is also possible to provide the load data field 21 and the control instruction field 22 as a memory independent of the instruction memory 12' and concurrently access them using an address produced by the program counter 11.

Figure 3:
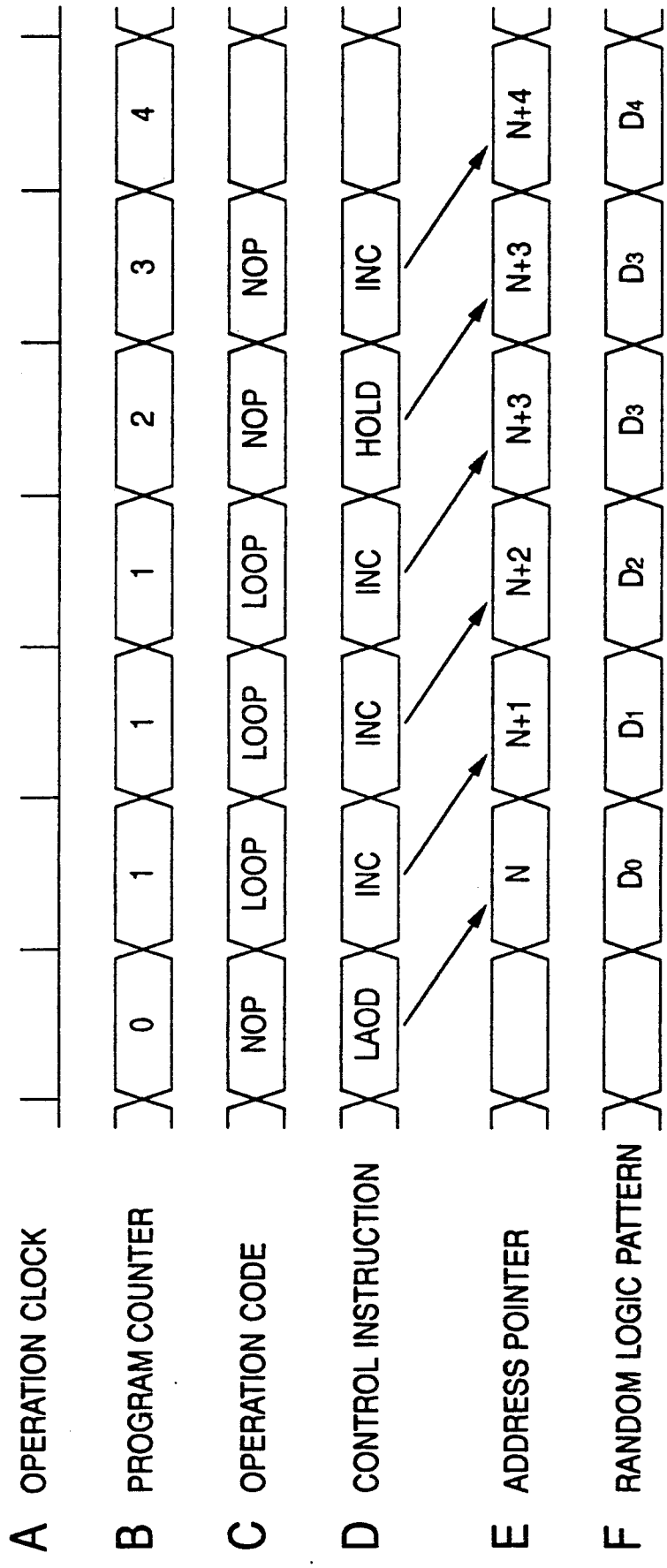
FIG. 3 is a timing chart for explaining the operation of the embodiment depicted in FIG. 2.

Next, a description will be given, with reference to the timing chart shown in FIG. 3, of an example of the generation of random logic patterns according to the embodiment depicted in FIG. 2. Incidentally, no description will be made of the generation of the address pattern AP, the data pattern DP and the expectation pattern EP for test use, because they are disclosed in the afore-mentioned U.S. Pat. No. 4,293,750.

Let it be assumed, for example, that there are stored in the instruction memory 12' operation codes NOP (no operation), LOOP (loop), NOP and NOP at addresses 0 to 3 of the operation code field 13, data 3 at an address 1 of the operand field 14, control instructions LOAD (load), INC (increment), HOLD (hold) and INC at addresses 0 to 3 of the control instruction field 22, and data N at an address 0 of the load data field 21, and that there are stored random logic pattern data $D_0, D_1, \ldots, D_4$ in the data buffer memory 18 at addresses N to N+4. Each random logic pattern D includes at least one of a test pattern to be applied to a logic circuit 25b of a device under test 25 and an expectation pattern for comparison with the output from the logic circuit 25b.

When an initial value 0 of the program counter 11 is provided as an address to the instruction memory 12', the operation code NOP, the control instruction LOAD and the load data N are read out of its address 0. The NOP code thus read out is decoded by the instruction decoder 16 and its output enables the program counter 11 to be incremented; so that the program counter 11 is incremented by one with the next operation clock and outputs an address "1". At the same time, the read-out load data N is set in the address pointer 19 by the control instruction LOAD, and as a result, the random logic pattern $D_0$ is read out of the address N of the data buffer memory 18. Next, the operation code LOOP, the operand "3" and the control instruction INC are read out by the address "1" created by the program counter 11. The LOOP code is decoded by the instruction decoder 16, the output of which disables the program counter 11 to be incremented by the number of times corresponding to the operand "3" as shown at rows B and C in FIG. 3, and at the same time, the address pointer 19 is incremented three times by the control instruction INC (row D in FIG. 3). In consequence, the random logic patterns $D_1$, $D_2$ and $D_3$ are read out of the addresses $N+1$, $N+2$ and $N+3$ of the data buffer memory 18 in synchronism with the operation clock, as shown at rows E and F in FIG. 3.

When the LOOP operation has been executed three times, the program counter 11 is enabled to be incremented and yields an address "2". By this address the code NOP and the control instruction HOLD are read out, with the result that the output of the instruction decoder enables the program counter 11 to be incremented by one and the current content "$N+3$" of the address pointer 19 is held. Consequently, when the next operation clock occurs, the program counter 11 is incremented by one and provides an address "3", and the random logic pattern $D_3$ is read out again from the address "$N+3$" of the data buffer memory 18. Similarly, by the code NOP and the control instruction INC similarly read out of an address "3" of the instruction memory 12', output addresses "4" and "$N+4$", respectively, reading out the random logic pattern $D_4$ from the address "$N+4$" of the data buffer memory 18.

Test patterns in the random logic patterns D read out of the data buffer memory 18, are sequentially applied to the logic circuit 25b of the device under test 25 to check its output, and expectation patterns are sequentially compared with the output of the logic circuit 25b. In this instance, a memory 25a in the device under test 25 can be tested as in the prior art by use of the address pattern AP, the data pattern DP and the expectation pattern EP created by the arithmetic unit 17, but as will be seen from the embodiment of FIG. 2, the device under test 25 may also be a mere integrated logic circuit having no memory or a mere memory having no logic circuit 25b.

As described above, according to the present invention, the data buffer memory 18 is provided which has stored therein random logic patterns. The memory 18 is accessed using the output address of the address pointer 19, and its address generation is controlled by data in the load data memory (i.e. the load data field) 21 and control instructions in the control instruction memory (i.e. the control instruction field) 22. The memories 21 and 22 are simultaneously accessed by the output address of the program counter 11. Thus, random logic patterns can be generated with a simple structure with no appreciable increase in the capacity of the instruction memory 12'.

What is claimed is:

1. A pattern generator for testing a device under test which includes a logic circuit part and memory part, comprising:

an instruction memory including a first field storing sequence instructions describing a sequence of steps for generating test patterns, and a second field for specifying operation instructions to be executed for generation of algorithmic logic patterns;

an instruction decoder, coupled to said instruction memory, for decoding the sequence instructions read out of said first field of said instruction memory;

a program counter, coupled to said instruction memory and said instruction decoder, for generating addresses for accessing, simultaneously, said first and second fields of said instruction memory in accordance with the decoded outputs from said instruction decoder;

an arithmetic unit, coupled to said instruction memory and the memory part of the device under test, for generating the algorithmic logic patterns by arithmetic operation in accordance with the operation instructions read out from said second field of said instruction memory, and for supplying the algorithmic logic patterns to the memory part of the device under test;

a data buffer memory which has stored therein random logic patterns for testing the logic circuit part of the device under test;

a control instruction memory for storing control instructions for controlling a sequence of generation of the random logic patterns;

an address pointer, coupled to said data buffer memory and said control instruction memory, to generate, under control of the control instructions from said control instruction memory, addresses for accessing said data buffer memory and selectively reading out therefrom the random logic patterns; and a load data memory coupled to said address pointer, to hold address data to be set in said address pointer, said load data memory and said control instruction memory being simultaneously accessed by the address created by said program counter.

2. A pattern generator according to claim 1, wherein said load data memory and said control instruction memory are formed as fields of said instruction memory which are accessed by the addresses created by said program counter.

* * * * *

UNITED STATES PATENT AND TRADEMARK OFFICE
CERTIFICATE OF CORRECTION

PATENT NO. : 5,127,010
DATED : JUNE 30, 1992
INVENTOR(S) : KAZUHIKO SATOH

It is certified that error appears in the above-identified patent and that said Letters Patent is hereby corrected as shown below:

Col. 2, line 5, "illustrating" should be --of--.

Col. 3, line 26, "12', output" should be --12', the program counter 11 and the address pointer 19 are incremented by one with the next operation clock and output--.

Signed and Sealed this

Seventeenth Day of August, 1993

Attest:

BRUCE LEHMAN

Attesting Officer          Commissioner of Patents and Trademarks